(12) United States Patent
Howard et al.

(10) Patent No.: US 9,458,011 B2
(45) Date of Patent: *Oct. 4, 2016

(54) SCALABLE SELF-SUPPORTED MEMS STRUCTURE AND RELATED METHOD

(71) Applicant: Newport Fab, LLC, Newport Beach, CA (US)

(72) Inventors: David J. Howard, Irvine, CA (US); Michael J. DeBar, Tustin, CA (US); Jeff Rose, Hawthorne, CA (US); Arjun Kar-Roy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/719,087

(22) Filed: May 21, 2015

(65) Prior Publication Data
US 2015/0368092 A1     Dec. 24, 2015

Related U.S. Application Data

(60) Provisional application No. 62/016,206, filed on Jun. 24, 2014.

(51) Int. Cl.
| | |
|---|---|
| *H01L 21/4763* | (2006.01) |
| *B81C 1/00* | (2006.01) |
| *B81B 3/00* | (2006.01) |
| *H01L 29/417* | (2006.01) |
| *H01L 21/768* | (2006.01) |

(52) U.S. Cl.
CPC ........... *B81C 1/00111* (2013.01); *B81B 3/007* (2013.01); *B81B 2203/0307* (2013.01); *B81C 1/00166* (2013.01); *B81C 1/00658* (2013.01); *H01L 21/47635* (2013.01); *H01L 21/76883* (2013.01); *H01L 29/417* (2013.01)

(58) Field of Classification Search
CPC ............. B81B 3/007; B81C 1/00111; B81C 1/00166; B81C 1/00658; H01L 21/47635; H01L 21/76883; H01L 29/417
USPC .................... 257/773; 438/98, 672
See application file for complete search history.

(56) References Cited

U.S. PATENT DOCUMENTS

| | | | | |
|---|---|---|---|---|
| 7,387,939 B2* | 6/2008 | Manning | ........... | H01L 27/10852 257/E21.019 |
| 7,420,238 B2* | 9/2008 | Manning | ........... | H01L 27/10817 257/301 |
| 7,601,629 B2* | 10/2009 | Ramappa | .......... | H01L 21/76802 257/758 |
| 2004/0256559 A1* | 12/2004 | Ryu | ........................ | G01J 5/02 250/338.3 |
| 2012/0138436 A1* | 6/2012 | Gambino | ........... | H01H 59/0009 200/181 |
| 2013/0207746 A1* | 8/2013 | Gupta | .................... | H03H 9/462 333/186 |
| 2015/0187714 A1* | 7/2015 | Bhatkar | .................. | H01L 24/13 257/737 |

* cited by examiner

*Primary Examiner* — George Fourson, III
(74) *Attorney, Agent, or Firm* — Farjami & Farjami LLP

(57) ABSTRACT

Self-supported MEMS structure and method for its formation are disclosed. An exemplary method includes forming a polymer layer over a MEMS plate over a substrate, forming a trench over the MEMS plate, forming an oxide liner in the trench on sidewalls of the trench, forming a metal liner over the oxide liner in the trench, and depositing a metallic filler in the trench to form a via. The method further includes removing the polymer layer such that the via and the MEMS plate form the self-supported MEMS structure, where the oxide liner provides mechanical rigidity for the metallic filler of the via. An exemplary structure formed by the disclosed method is also disclosed.

20 Claims, 11 Drawing Sheets

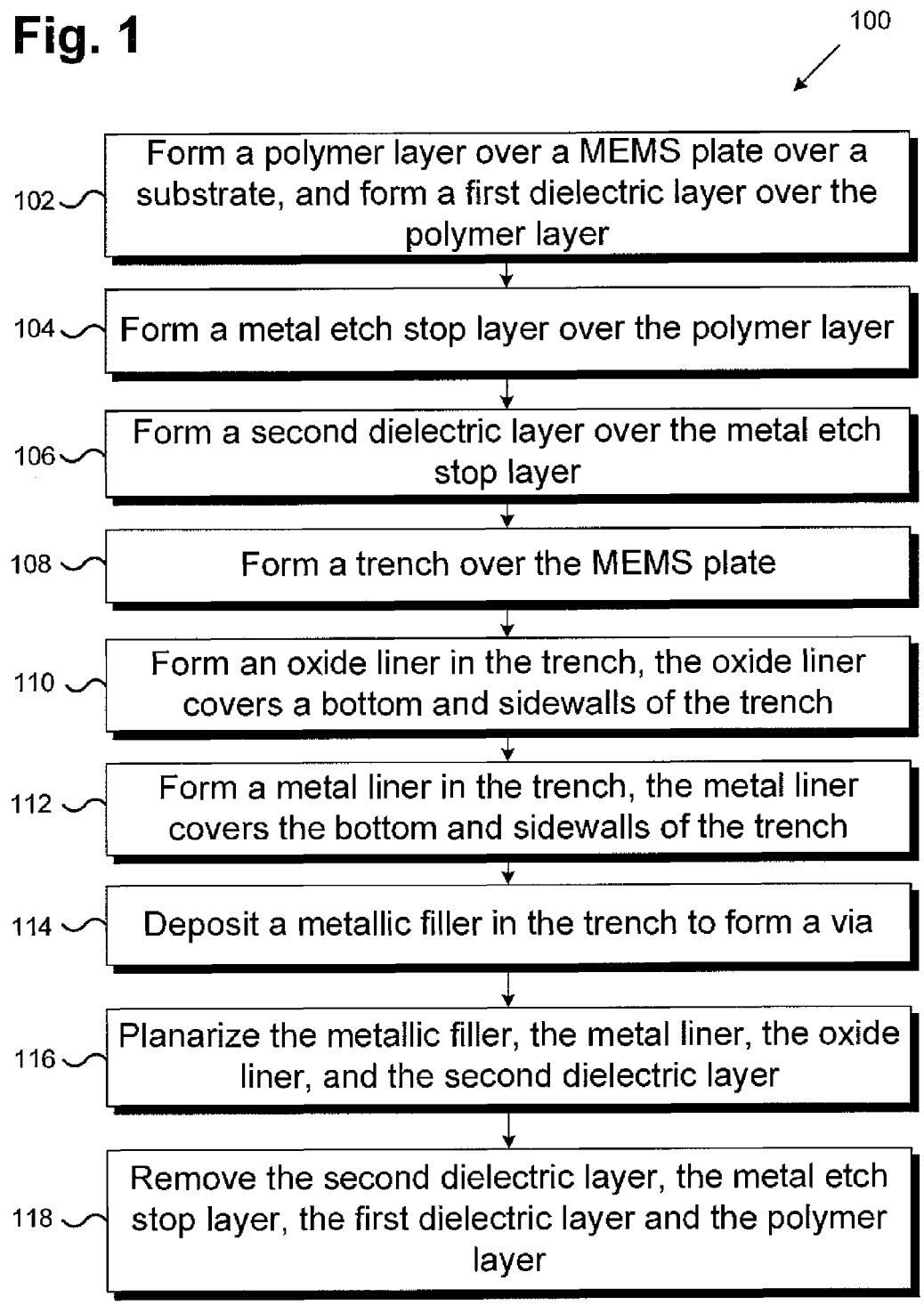

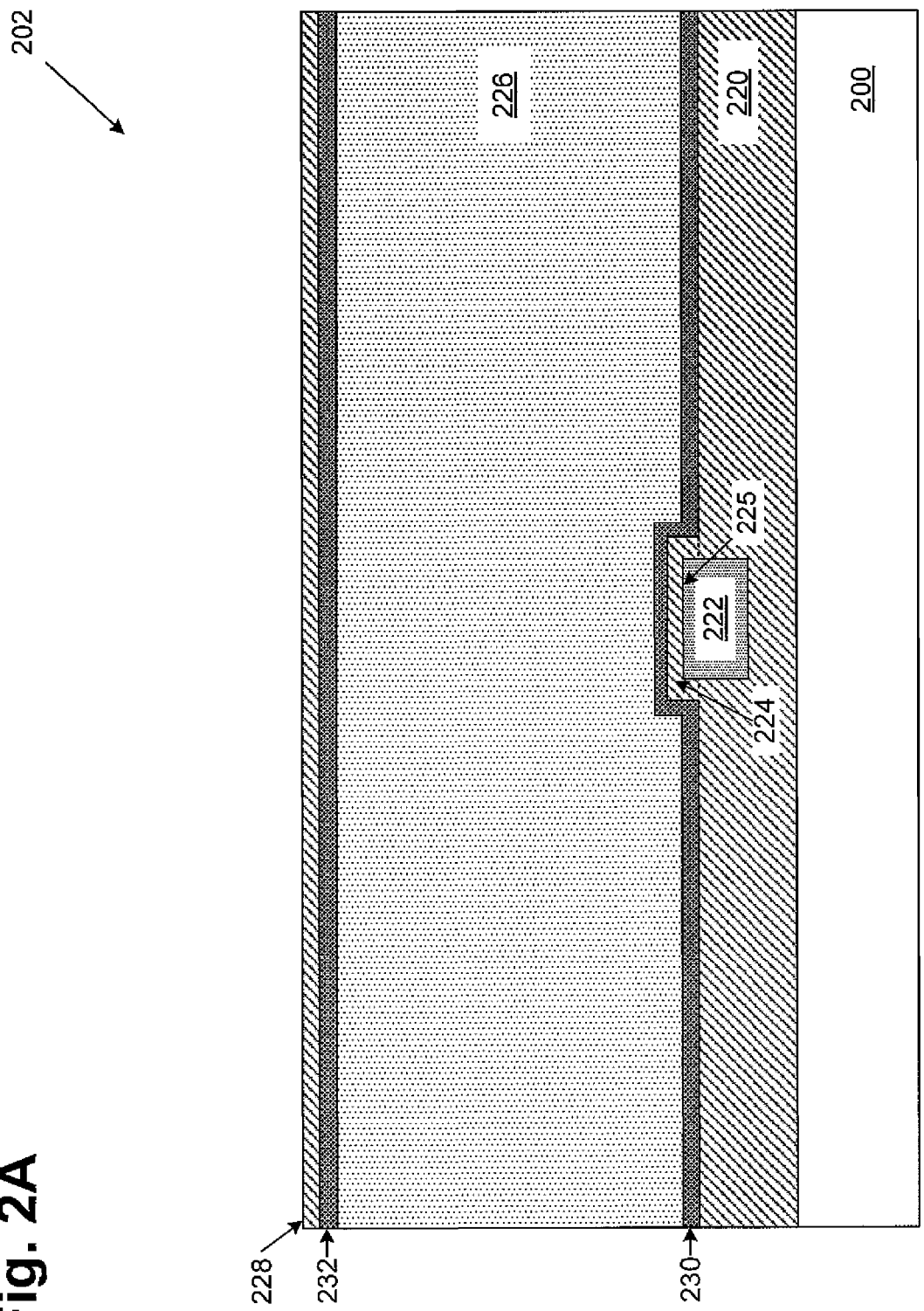

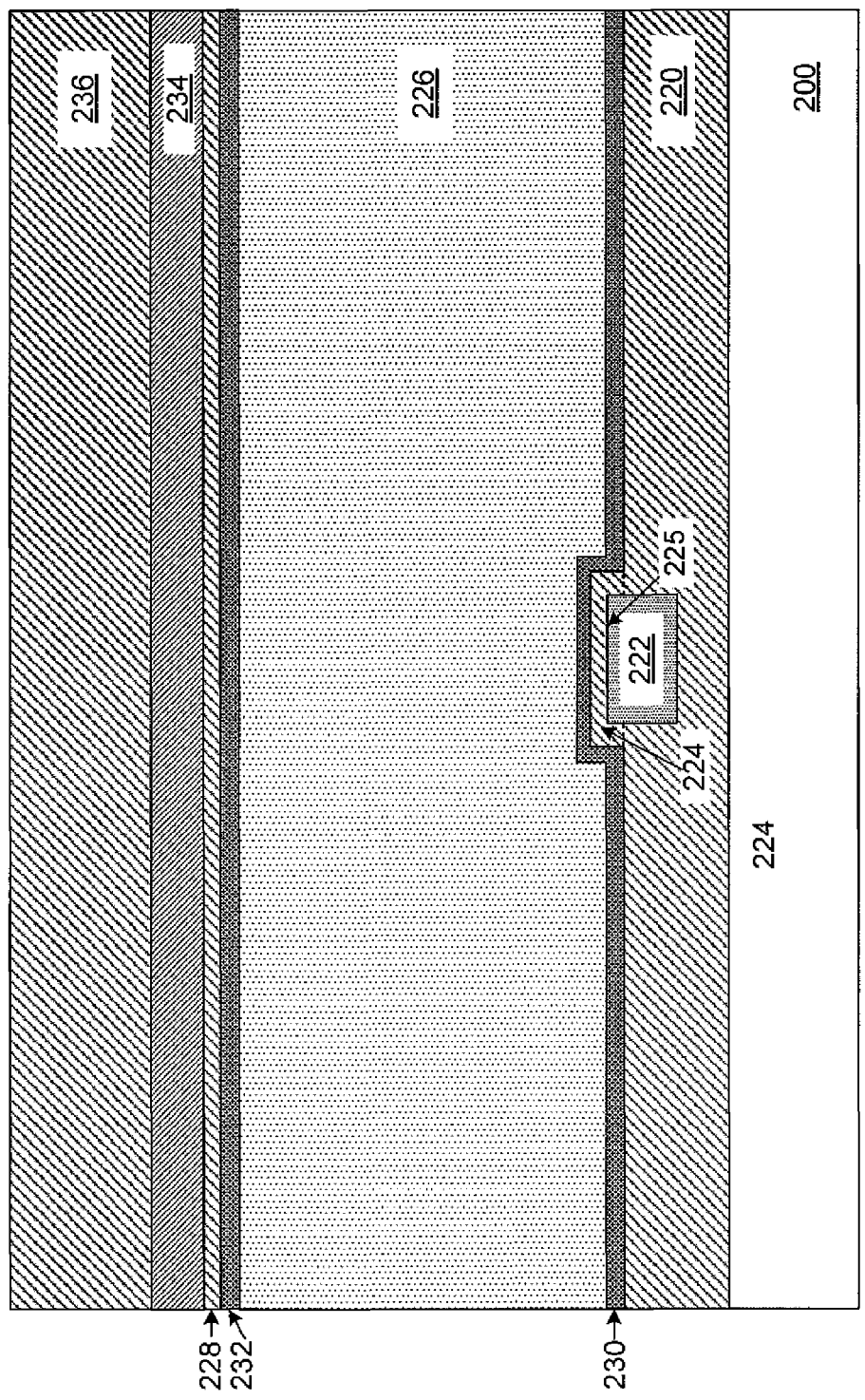

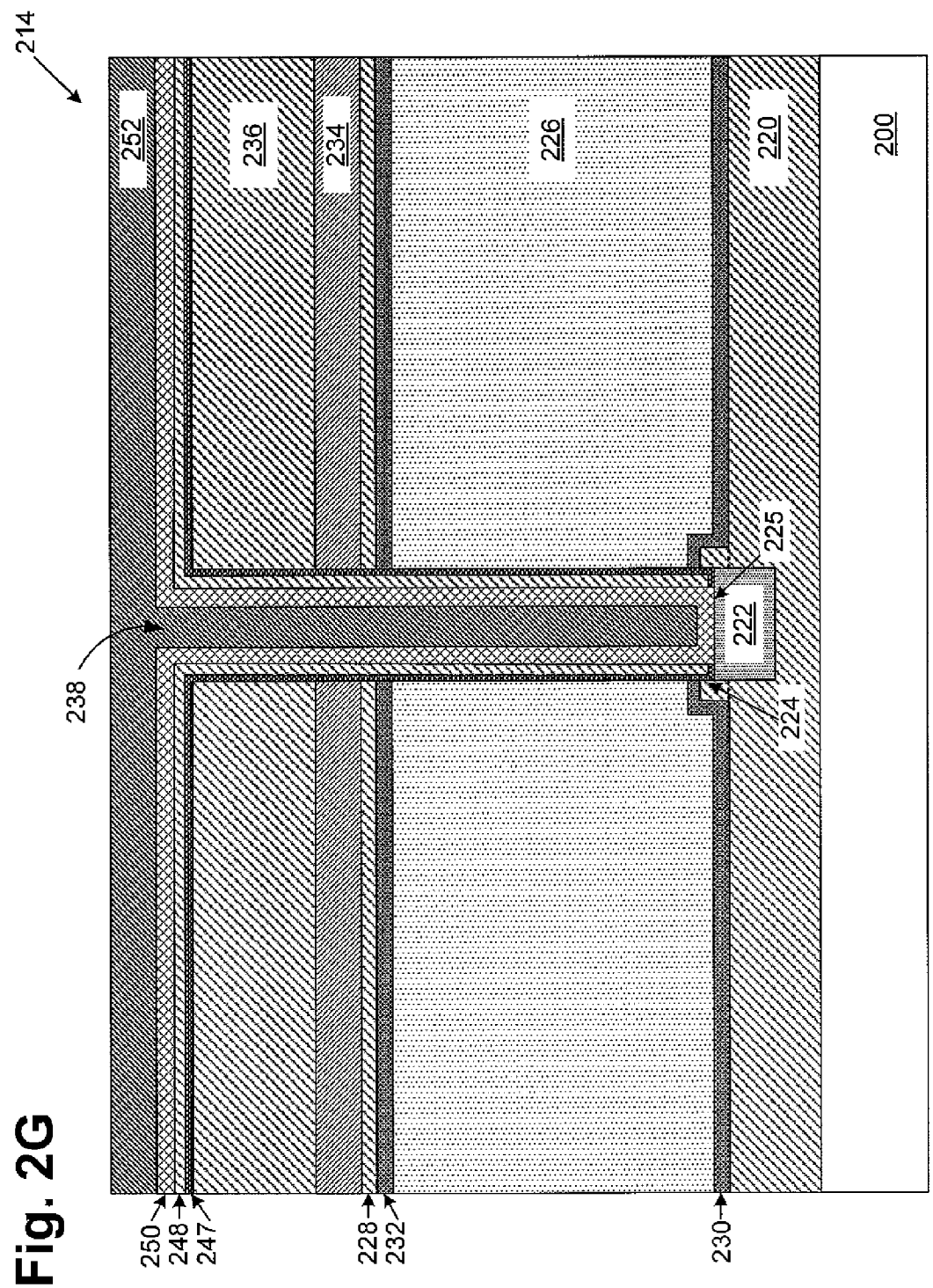

SCALABLE SELF-SUPPORTED MEMS STRUCTURE AND RELATED METHOD

The present application claims the benefit of and priority to a provisional patent application entitled "Scalable Electrical and Structural Self-Supported MEMS Features," Ser. No. 62/016,206 filed on Jun. 24, 2014. The disclosure in this provisional application is hereby incorporated fully by reference into the present application.

BACKGROUND

Process integration of mechanical and/or electrical support features of Micro-Electro-Mechanical Systems (MEMS) devices often present the challenge of scaling the building blocks or fundamental units of the MEMS devices. For example, conventional MEMS devices, such as microbolometer structures, rely on large vias and trenches to support suspended sensor membranes. To achieve mechanical and/or electrical robustness, however, these large vias and trenches are difficult to scale down.

In a conventional approach of manufacturing a support structure for a suspended MEMS device, a large trench is formed in a sacrificial material layer, and then a metal is deposited in the trench. The formation of the trench in the sacrificial material layer, such as a polymer layer, presents challenges during manufacturing processes since polymers are visco-elastic and tend to outgas during thermal and chemical processes. The carbonaceous sacrificial material layer can in turn cause deformation of the trench as well as the metal filament inside. Via deformation may cause structural instability of the support structure. In some extreme cases, via deformation may cause mechanical and electrical detachment of the via from its underlying contact, which may render the MEMS device inoperable. Moreover, in the conventional approach, the support structure having a metal filling may be susceptible to chemical attacks during subsequent BEOL (back end of line) processes, which may further weaken the support structure.

As dimensions of MEMS structures continue to scale down in size, MEMS device support structures also need to scale down proportionally with the MEMS structures to conserve valuable surface area on a semiconductor wafer, while still being able to uphold the structural integrity of the MEMS structures. Thus, there is a need in the art for high volume manufacturing of scalable, robust self-supported MEMS structures.

SUMMARY

The present disclosure is directed to scalable self-supported MEMS structure and related method, substantially as shown in and/or described in connection with at least one of the figures, and as set forth in the claims.

BRIEF DESCRIPTION OF THE DRAWINGS

FIG. 1 is a flowchart illustrating a method of forming a self-supported MEMS structure according to one implementation of the present application.

FIG. 2A illustrates a cross-sectional view of a portion of a self-supported MEMS structure processed in accordance with an initial action in the flowchart of FIG. 1 according to one implementation of the present application.

FIG. 2C illustrates a cross-sectional view of a portion of a self-supported MEMS structure processed in accordance with an intermediate action in the flowchart of FIG. 1 according to one implementation of the present application.

FIG. 2G illustrates a cross-sectional view of a portion of a self-supported MEMS structure processed in accordance with an intermediate action in the flowchart of FIG. 1 according to one implementation of the present application.

FIG. 2I illustrates a cross-sectional view of a portion of a self-supported MEMS structure processed in accordance with a final action in the flowchart of FIG. 1 according to one implementation of the present application.

DETAILED DESCRIPTION

Figure 2B:
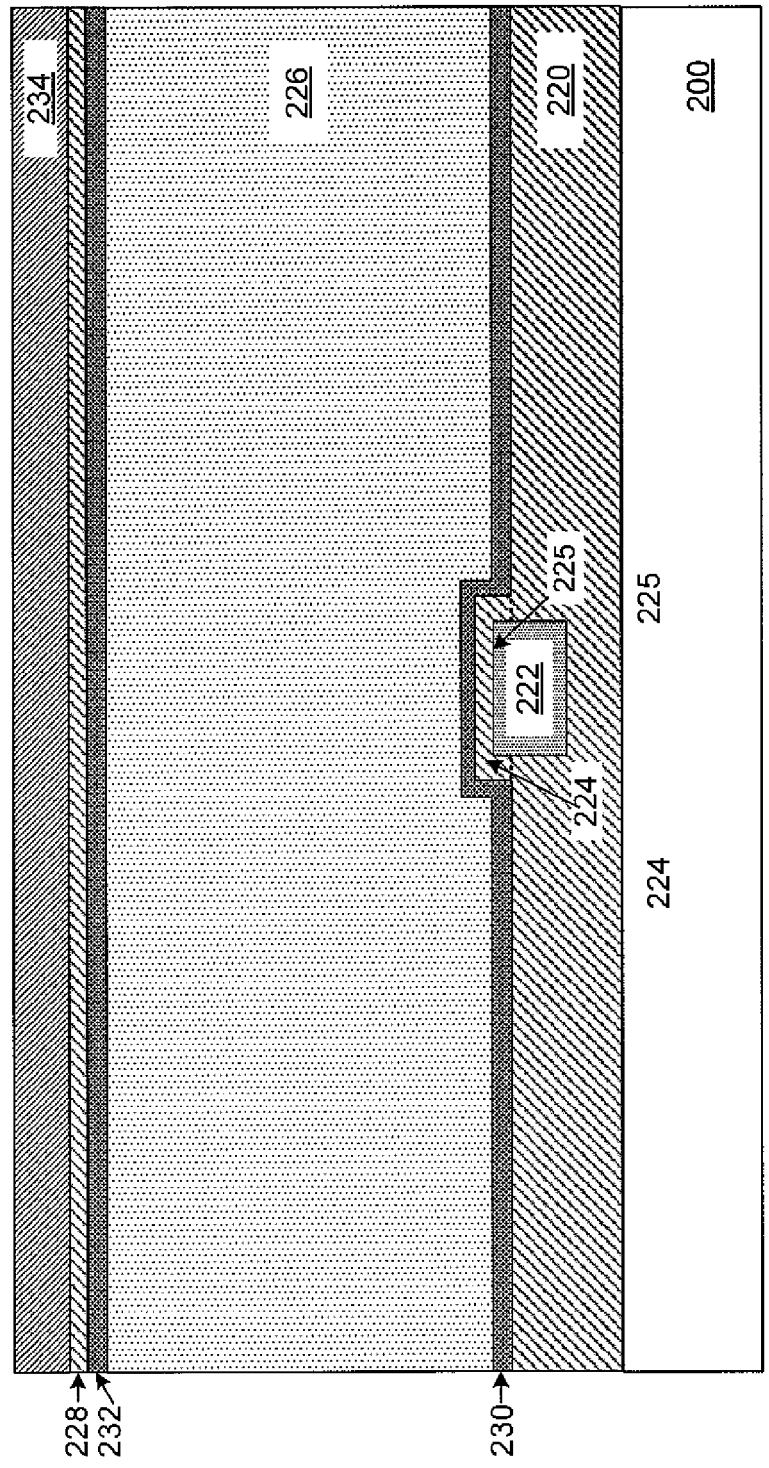
FIG. 2B illustrates a cross-sectional view of a portion of a self-supported MEMS structure processed in accordance with an intermediate action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming a self-supported MEMS structure according to an implementation of the present inventive concepts. Certain details and features have been left out of flowchart 100 that are apparent to a person of ordinary skill in the art. For example, an action may consist of one or more subactions or may involve specialized equipment or materials, as known in the art. Actions 102 through 118 indicated in flowchart 100 are sufficient to describe one implementation of the present inventive concepts, other implementations of the present inventive concepts may utilize actions different from those shown in flowchart 100.

In FIGS. 2A through 2I, structures 202 through 218 illustrate the result of performing actions 102 through 118 of flowchart 100, respectively. For example, structure 202 is a portion of a self-supported MEMS structure after processing action 102, structure 204 is an exemplary structure after the processing of action 104, structure 206 is an exemplary structure after the processing of action 106, and so forth.

Referring to action 102 in FIG. 1 and structure 202 in FIG. 2A, structure 202 shows a portion of an exemplary self-supported MEMS structure having a polymer layer formed over a MEMS plate over a substrate, and a first dielectric layer formed over the polymer layer, after completion of action 102 of flowchart 100 in FIG. 1. As illustrated in FIG. 2A, structure 202 includes substrate 200, underlying oxide layer 220, MEMS plate 222, conformal oxide layer 224, polymer layer 226, first dielectric layer 228, and optional adhesion promoting (AP) layers 230 and 232.

Prior to action 102 of flowchart 100, MEMS plate 222 is formed in underlying oxide layer 220 over substrate 200. In the present implementation, substrate 200 may be a silicon substrate. In other implementations, substrate 200 may include other suitable substrate material, such as silicon-on-insulator (SOI), silicon-on-sapphire (SOS), silicon germanium, germanium, an epitaxial layer of silicon formed on a silicon substrate, or the like. In the present implementation, underlying oxide layer 220 may include silicon oxide or silicon rich oxide, for example. MEMS plate 222 is formed in underlying oxide layer 220. For example, in the present implementation, MEMS plate 222 may be a portion of a reflector of a microbolometer. In another implementation, MEMS plate 222 may be a portion of a bi-layer actuator for a MEMS device fabricated from aluminum, for example. In yet another implementation, MEMS plate 222 may be a portion of an interconnect metal of a MEMS device. As illustrated in FIG. 2A, a portion of MEMS plate 222 protrudes from underlying oxide layer 220, and is covered by conformal oxide layer 224, where conformal oxide layer 224 may be formed by the same material as underlying oxide layer 220 to form a silicon rich interface for receiving polymer layer 226.

As illustrated in FIG. 2A, polymer layer 226 is formed over underlying oxide layer 220 and conformal oxide layer 224. AP layer 230 may be optionally formed over underlying oxide layer 220 and conformal oxide layer 224 before the deposition of polymer layer 226 to improve adhesion between the polymer and the oxide layers. In the present implementation, polymer layer 226 may include polyimides. In other implementations, exemplary materials that may be used to form polymer layer 226 may include, but not limited to, polyamides (e.g., HD-2610), SU-8 photoresist, spin-on dielectrics (SOD), long chain polymers up to 10 microns. Polymer layer 226 may also include polyarylates, polybenzimidazole, polybutylene, polycarbonate, polyesters, polyetherimide, polyethylene, polyethylene copolymers and modified polyethylenes, polyketones, polymethyl methacrylate, polymethylpentene, polyphenylene oxides and polyphenylene sulfides, polyphthalamide, polypropylene, polyurethanes, styrenic resins, sulphone based resins, vinyl-based resins or any combination thereof.

Thereafter, first dielectric layer 228 is formed over polymer layer 226. First dielectric layer 228 may include an oxide layer having silicon oxide or silicon rich oxide, for example. In one implementation, first dielectric layer 228 may include a silicon rich surface interfacing polymer layer 226. First dielectric layer 228 may be formed over polymer layer 226 using physical vapor deposition (PVD), chemical vapor deposition (CVD), plasma enhanced chemical vapor deposition (PECVD), thermal CVD, or spin-coating. In other implementations, first dielectric layer 228 may be formed by using other deposition methods, such as high density plasma (HDP), ion beam deposition (IBD), or ion assisted deposition (IAD).

Similar to AP layer 230, AP layer 232 may be optionally formed over polymer layer 226 before the deposition of first dielectric layer 228 to improve adhesion between polymer layer 226 and first dielectric layer 228. In the present implementation, AP layers 230 and 232 may be a spin on water-soluble material. In other implementations, AP layers 230 and 232 may be any other appropriate adhesion promoting material known in the art.

Referring to action 104 in FIG. 1 and structure 204 in FIG. 2B, structure 204 shows a portion of an exemplary self-supported MEMS structure having a metal etch stop layer formed over a first dielectric layer, after completion of action 104 of flowchart 100 in FIG. 1. Specifically, in structure 204, metal etch stop layer 234 is deposited over first dielectric layer 228. For example, metal etch stop layer 234 may be made of titanium (Ti), titanium nitride (TiN), or a combination of both materials. Metal etch stop layer 234 together with first dielectric layer 228 are configured to protect polymer layer 226 and preserve the thickness of polymer layer 226 over the entire semiconductor wafer throughout the entire process flow. As such, polymer layer 226 is well preserved in all areas of the semiconductor wafer to provide a substantially flat surface, as a foundation, for additional semiconductor structures built over polymer layer 226.

Referring to action 106 in FIG. 1 and structure 206 in FIG. 2C, structure 206 shows a portion of an exemplary self-supported MEMS structure having a second dielectric layer over a metal etch stop layer, after completion of action 106 of flowchart 100 in FIG. 1. Specifically, in structure 206, second dielectric layer 236 is formed over metal etch stop layer 234. For example, second dielectric layer 236 is formed on metal etch stop layer 234 by using PECVD. In the present implementation, second dielectric layer 236 may include silicon oxide. In another implementation, second dielectric layer 236 may include silicon nitride, or other appropriate dielectric material. In cases where second dielectric layer 236 is made of ceramic material, second dielectric layer 236 would shrink as it cools down, thereby creating much stress which could lead to delamination of second dielectric layer 236 from metal etch stop layer 234. To reduce the stress in second dielectric layer 236, in one implementation, second dielectric layer 236 may be formed by modifying deposition conditions.

As illustrated in FIG. 2C, in the present implementation, second dielectric layer 236 may have a thickness that is substantially thicker than first dielectric layer 228. The thickness of second dielectric layer 236 is critical. For example, an appropriate thickness of second dielectric layer 236 has to be carefully selected such that it has a sufficient thickness to serve as a protective stop layer during subsequent processing actions, and at the same time not overly thick since second dielectric layer 236 would not adhere thus peel off from metal etch stop layer 234.

Figure 2D:
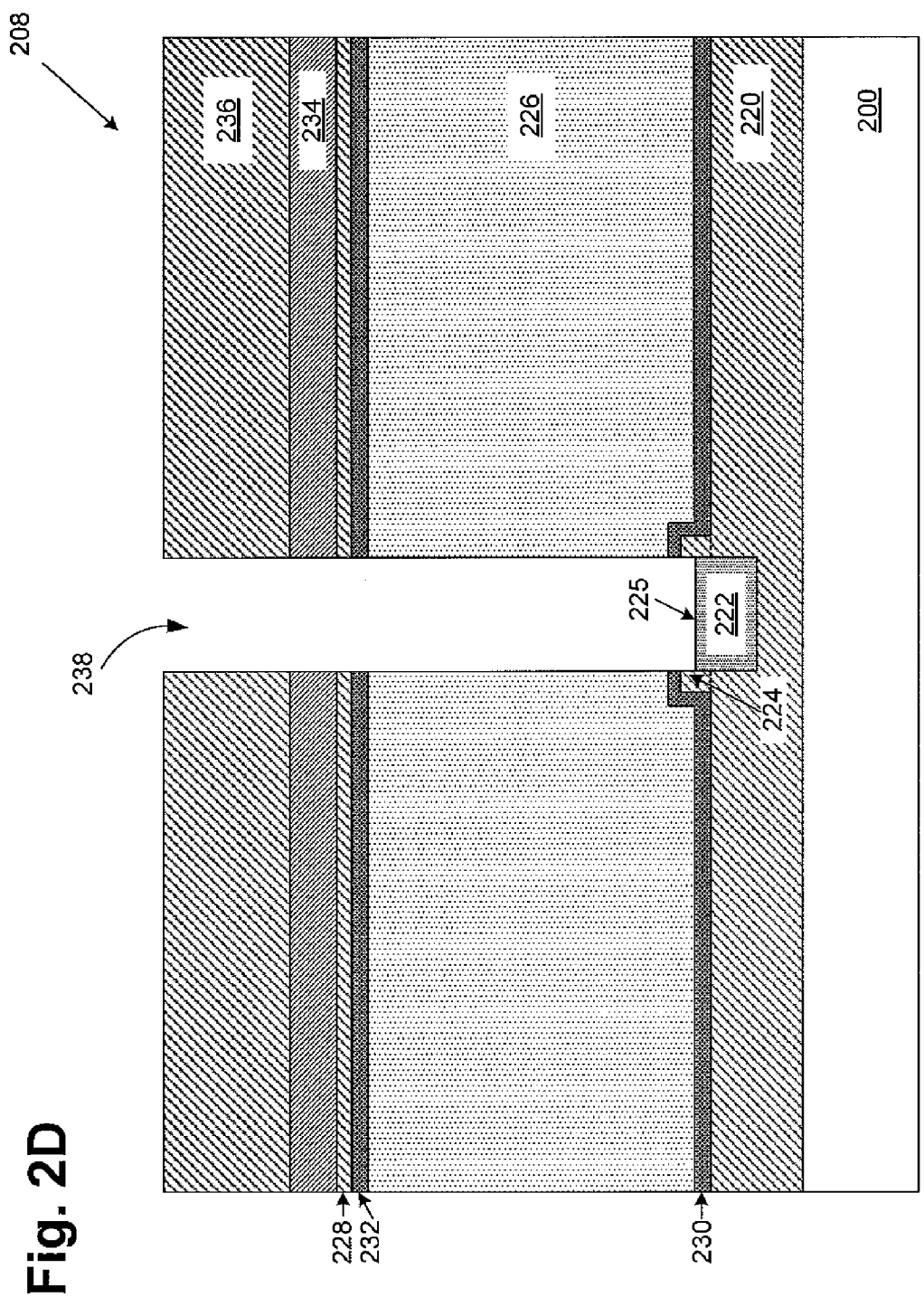
FIG. 2D illustrates a cross-sectional view of a portion of a self-supported MEMS structure processed in accordance with an intermediate action in the flowchart of FIG. 1 according to one implementation of the present application.

Referring to action 108 in FIG. 1 and structure 208 in FIG. 2D, structure 208 shows a portion of an exemplary self-supported MEMS structure having a trench formed over a MEMS plate, after completion of action 108 of flowchart 100 in FIG. 1. Specifically, in structure 208, trench 238 is formed over MEMS plate 222. In the present implementation, trench 238 may be formed by reactive ion etching (RIE) using oxygen with fluorine based chemistry or sulfur dioxide type chemistry, for example. In other implementations, trench 238 may be formed by other suitable etching processes known in the art. After the RIE, wet cleans may be performed to ensure that structure 208 has smooth and clean surfaces free from residues, impurities and other unwanted material.

As illustrated in FIG. 2D, the etching process etches through second dielectric layer 236, metal etch stop layer 234, first dielectric layer 228, AP layer 232, polymer layer 226, AP layer 230, and conformal oxide layer 224. In the present implementation, trench 238 exposes top surface 225 of MEMS plate 222. In another implementation, the etching of trench 238 terminates on a top surface of conformal oxide layer 224, which can be removed in a later processing action.

Figure 2E:
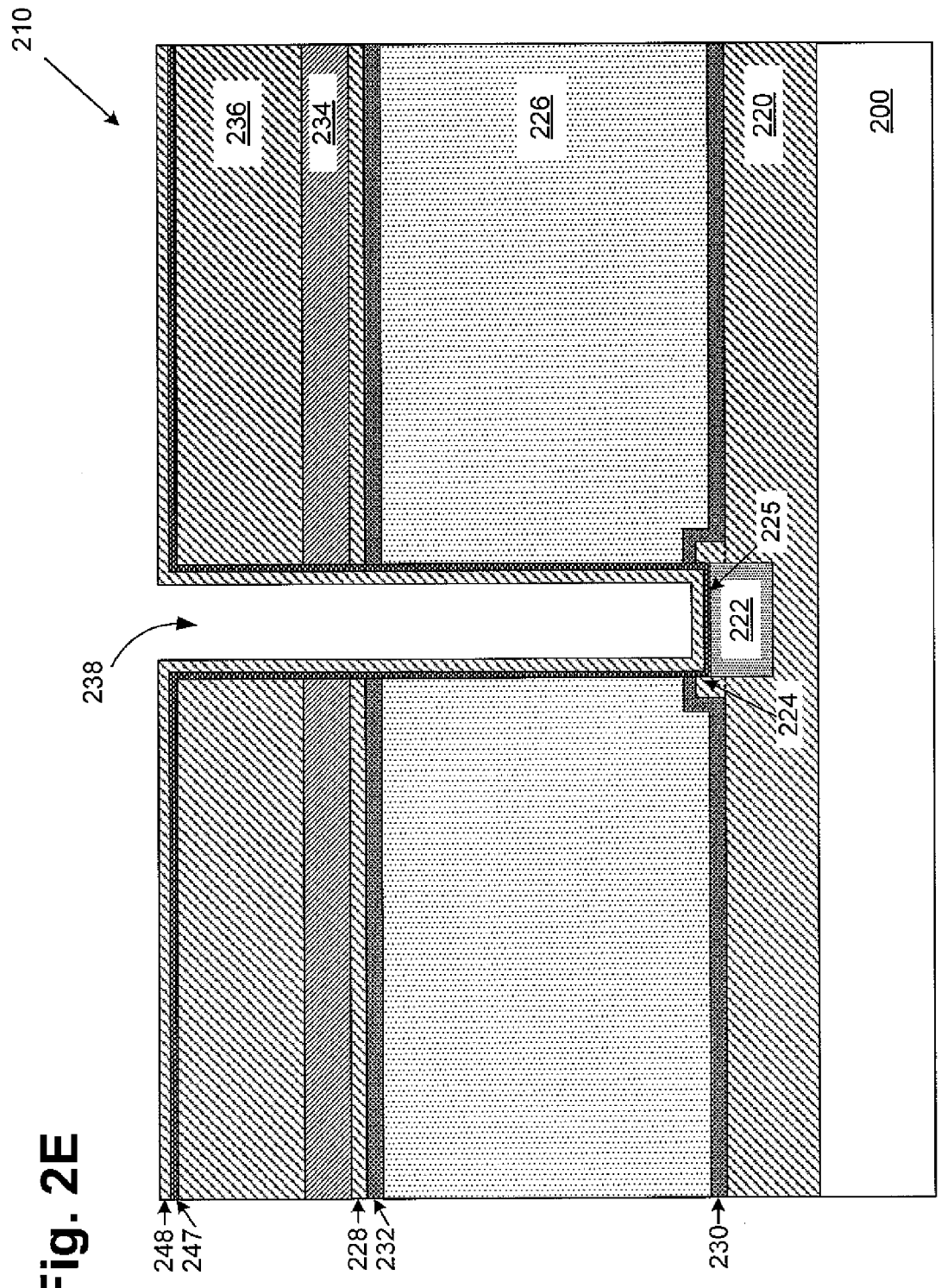
FIG. 2E illustrates a cross-sectional view of a portion of a self-supported MEMS structure processed in accordance with an intermediate action in the flowchart of FIG. 1 according to one implementation of the present application.

Referring to action 110 in FIG. 1 and structure 210 in FIG. 2E, structure 210 shows a portion of an exemplary self-supported MEMS structure having an oxide liner formed on sidewalls and a bottom of a trench, after completion of action 110 of flowchart 100 in FIG. 1. Specifically, in structure 210, oxide liner 248 is formed over second dielectric layer 236 and on sidewalls and the bottom of trench 238. As illustrated in FIG. 2E, oxide liner 248 is formed on top surface 225 of MEMS plate 222. In present implementation, oxide liner 248 may include silicon oxide or silicon rich oxide. In another implementation, oxide liner 248 may include a tetraethylorthosilicate (TEOS) liner. Oxide liner 248 may be formed by depositing an oxide using deposition methods such as PVD, CVD, PECVD, thermal CVD, or spin-coating, then etching back the deposited oxide using a blanket etch, for example. Oxide liner 248 encapsulates polymer layer 226, and acts as a protective layer to prevent polymer layer 226 from outgassing and deformation during subsequent metal deposition and annealing processes. Oxide liner 248 can also provide mechanical rigidity for filler materials subsequently deposited in trench 238 to form a self-supported MEMS structure. Moreover, oxide liner 248 can improve adhesion between the filler materials subsequently deposited in trench 238 and polymer layer 226.

As further illustrated in FIG. 2E, AP layer 247 may be optionally formed between oxide liner 248 and polymer layer 226 to improve adhesion between the two layers. Although AP layer 247 is not required, the presence of AP layer 247 in combination with oxide liner 248 may significantly improve adherence between a subsequently deposited metal liner and/or metallic filler and polymer layer 226.

Encasing the semiconductor wafer using AP layer 247 may also simplify the integration of high stress metals, such as tungsten, with polymer layer 226. In the present implementation, AP layer 247 may be a spin on water-soluble material. In other implementations, AP layer 247 may be any other appropriate adhesion promoting material known in the art.

Figure 2F:
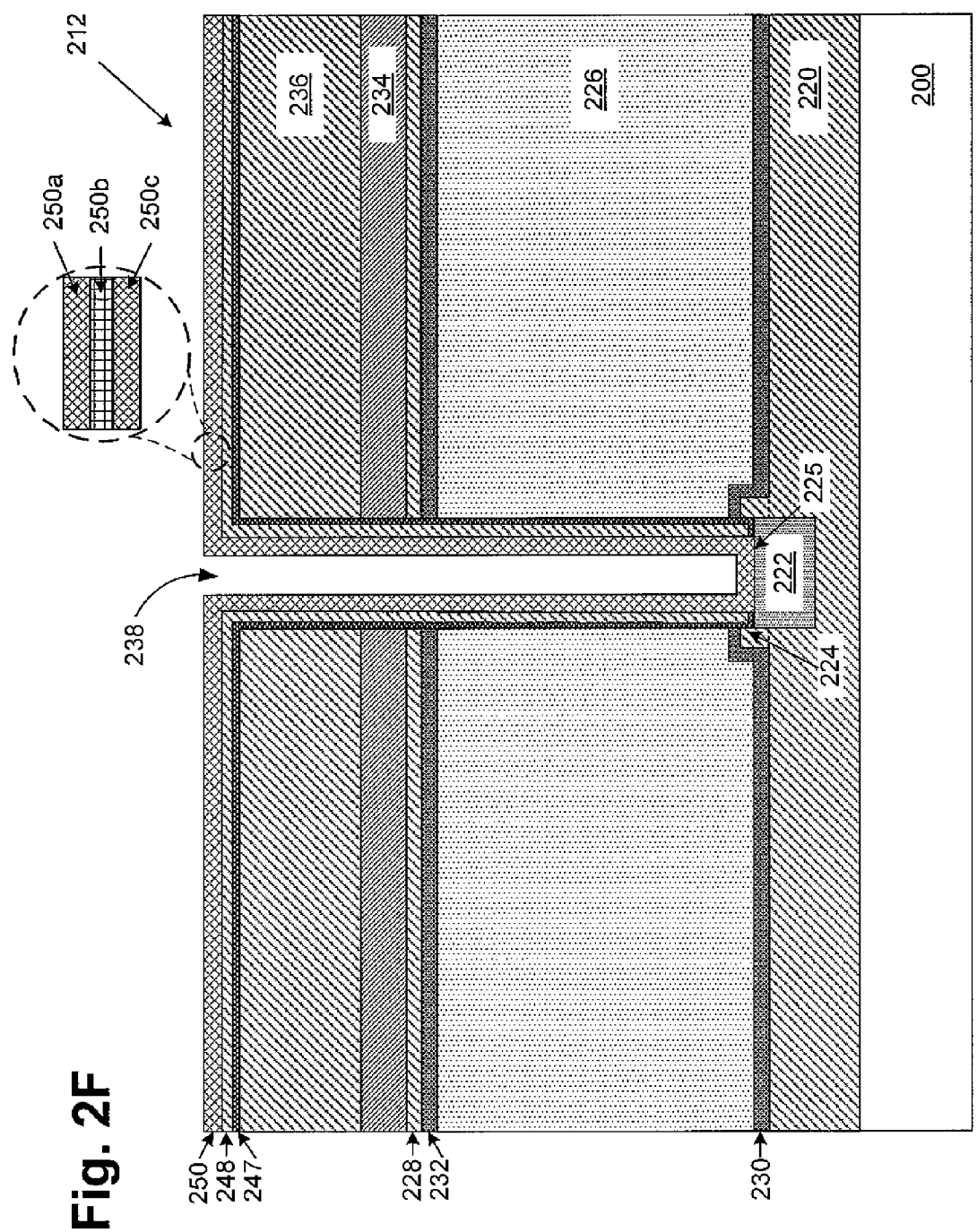
FIG. 2F illustrates a cross-sectional view of a portion of a self-supported MEMS structure processed in accordance with an intermediate action in the flowchart of FIG. 1 according to one implementation of the present application.

Referring to action 112 in FIG. 1 and structure 212 in FIG. 2F, structure 212 shows a portion of an exemplary self-supported MEMS structure having a metal liner formed over an oxide liner on sidewalls and a bottom of a trench, after completion of action 112 of flowchart 100 in FIG. 1. Specifically, in structure 212, metal liner 250 is formed over oxide liner 248 on sidewalls and the bottom of trench 238. Metal liner 250 may be formed by using any suitable deposition process. In the present implementation, metal liner 250 may include Ti layer 250a, TiN layer 250b, and Ti layer 250c, where TiN layer 250b is particularly formed as a Ti rich layer. A Ti rich layer may improve integration between metal liner 250 and a subsequently deposited metallic filler in trench 238.

As further illustrated in FIG. 2F, in the present implementation, portions of oxide liner 248 and AP layer 247 at the bottom of trench 238 may be removed prior to the deposition of metal liner 250, such that metal liner 250 is in direct contact with top surface 225 of MEMS plate 222. In other implementations, oxide liner 248 and AP layer 247 at the bottom of trench 238 need not be removed prior to the formation of metal liner 250. Oxide liner 248 provides mechanical rigidity and chemical protection for polymer layer 226 during the deposition of metal liner 250.

Referring to action 114 in FIG. 1 and structure 214 in FIG. 2G, structure 214 shows a portion of an exemplary self-supported MEMS structure having a metallic filler deposited in a trench to form a via over a MEMS plate, after completion of action 114 of flowchart 100 in FIG. 1. Specifically, in structure 214, metallic filler 252 is deposited in trench 238 by using low pressure chemical vapor deposition (LPCVD), for example, to form a via. In the present implementation, metallic filler 252 may include tungsten (W). In another implementation, metallic filler 252 may include other metallic material, such as Ti or any other suitable electrically conductive metallic filler or metallic filler stack. As tungsten may experience high stress during the deposition process, metal liner 250 having titanium rich layer as a CVD seed layer can advantageously help reduce the stress level in metallic filler 252.

Also, during the formation of the via, as polymer layer 226 is passivated by first dielectric layer 228 and oxide liner 248, polymer layer 226 is prevented from outgassing and deformation. As such, polymer layer 226 is able to provide a flat top surface in other areas of the semiconductor wafer for fabrication of other semiconductor devices, such as CMOS devices, over polymer layer 226. In addition, oxide liner 248 can improve adhesion between metallic filler 252 and polymer layer 226. Also, oxide liner 248 can provide a rigid structure during the deposition of metal liner 250 and metallic filler 252, as compared to depositing metal liner 250 and metallic filler 252 directly in polymer layer 226 without using oxide liner 248.

Figure 2H:
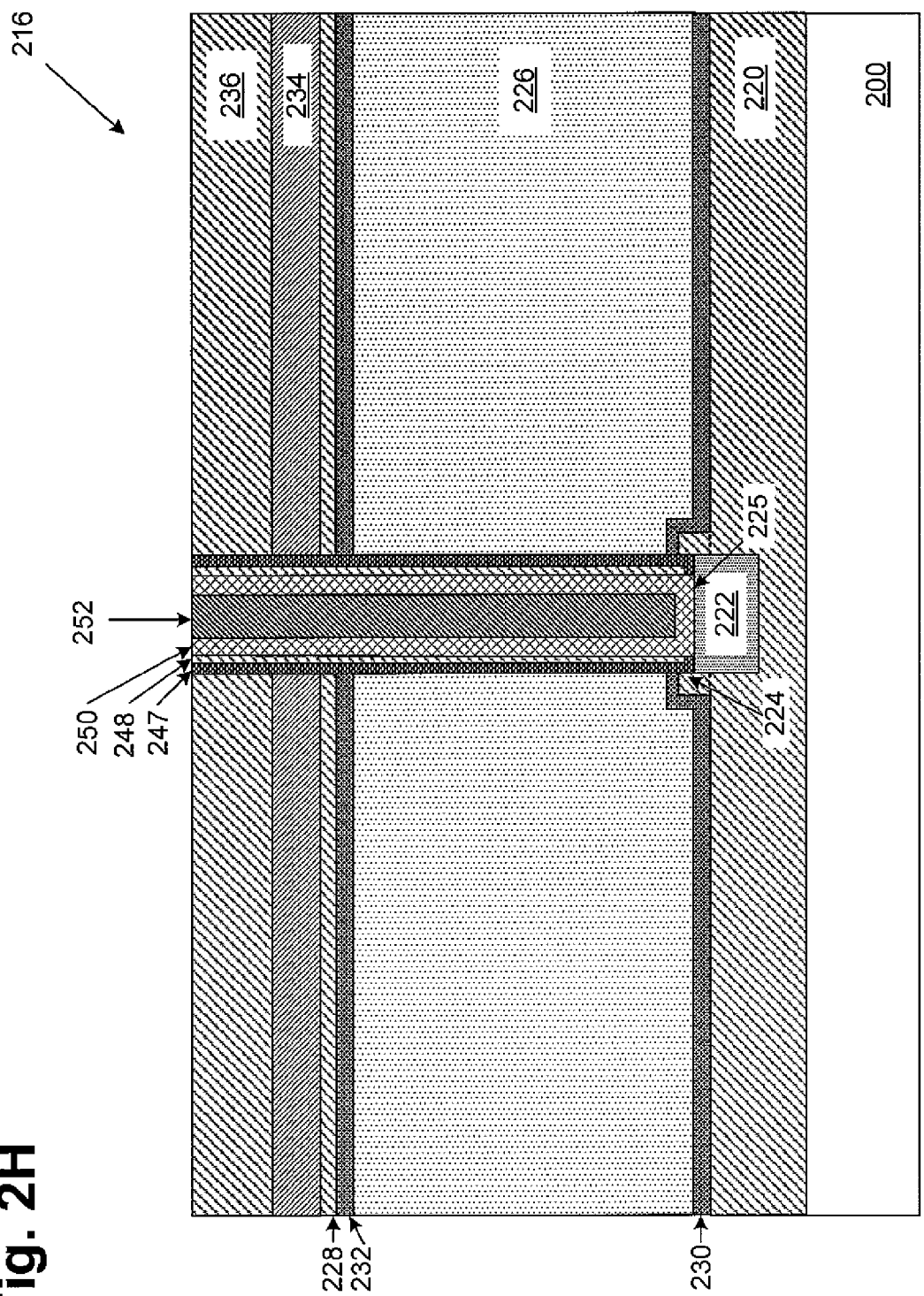
FIG. 2H illustrates a cross-sectional view of a portion of a self-supported MEMS structure processed in accordance with an intermediate action in the flowchart of FIG. 1 according to one implementation of the present application.
Figure 21:
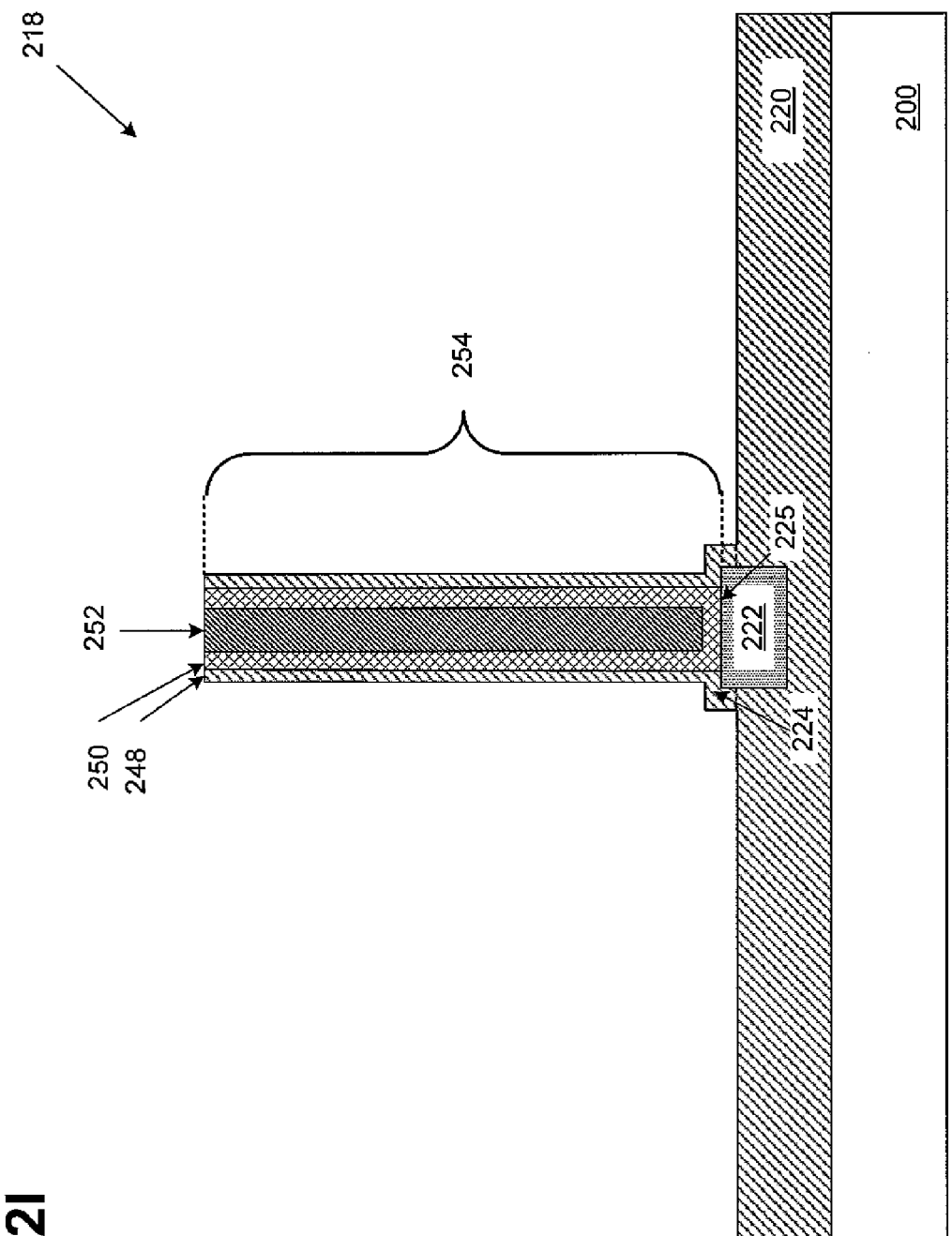

Referring to action 116 in FIG. 1 and structure 216 in FIG. 2H, structure 216 shows a portion of an exemplary self-supported MEMS structure having portions of a metallic filler, a metal liner, an oxide liner, an AP layer and a second oxide polished away by using, for example, a chemical-mechanical polishing (CMP) process, such that the metallic filler has a substantially co-planar top surface with the metal liner, the oxide liner, the AP layer and the second dielectric layer, after completion of action 116 of flowchart 100 in FIG. 1. As illustrated in FIG. 2H, structure 216 is planarized by, for example, CMP, such that excess portions of metallic filler 252, metal liner 250, oxide liner 248, AP layer 247, and second dielectric layer 236 as appeared in structure 214 in FIG. 2G are removed. As a result, metallic filler 252, metal liner 250, oxide liner 248, AP layer 247, and second dielectric layer 236 have a substantially co-planar top surface in structure 216.

Referring to action 118 in FIG. 1 and structure 218 in FIG. 2I, structure 218 shows a portion of an exemplary self-supported MEMS structure having a second dielectric layer, an metal etch stop layer, a first dielectric layer, a polymer layer and optional AP layers removed, such that the exemplary self-supported MEMS structure includes a self-supported via having a metallic filler and a metal liner coated with an oxide liner in a trench over a MEMS plate, after completion of action 118 of flowchart 100 in FIG. 1. As illustrated in FIG. 2I, second dielectric layer 236, metal etch stop layer 234, first dielectric layer 228, polymer layer 226 and optional AP layers 230, 232 and 247 as appeared in structure 216 in FIG. 2H are removed by, for example, various removal processes known in the art. For example, chlorine rich chemistry may be used to remove metal etch stop layer 234, while fluorine rich chemistry may be used to remove first dielectric layer 228 and AP layer 232. It is noted that optional AP layer 247 is not shown in FIG. 2I, such that oxide liner 248 and conformal oxide layer 224 form a continuous coating outside metal liner 250 and metallic filler 252.

As illustrated in FIG. 2I, after the removal of the above-mentioned layers, via 254 is shown standing on MEMS plate 222 over substrate 200. Via 254 includes oxide liner 248, metal liner 250 and metallic filler 252, where metal liner 250 and metallic filler 252 are coated with oxide liner 248 in trench 238. As oxide liner 248 provides mechanical rigidity for metal liner 250 and metallic filler 252, via 254 is a self-supported structure on top surface 225 of MEMS plate 222 after the removal of second dielectric layer 236, metal etch stop layer 234, first dielectric layer 228, polymer layer 226 and optional AP layers 230, 232 and 247. As such, via 254 is supported only on a bottom thereof by substrate 200 without a need for additional structural support.

By way of examples only, during the present implementation method, underlying oxide layer 220 may have a thickness of about 1-100 microns; conformal oxide layer 224 may have a thickness of equal to or greater than 100 angstroms; polymer layer 226 may have a thickness of about 1.5-2.5 microns; first dielectric layer 228 may have a thickness of equal to or greater than 100 angstroms; optional AP layers 230, 232 and 247 may each have a thickness of about 60-100 angstroms; metal etch stop layer 234 may have a thickness of about 500 angstroms; second dielectric layer 236 may have a thickness of about 0.2-1 microns; oxide liner 248 may have a thickness of about 500-1500 angstroms; metal liner 250 may have a thickness of about 300-1000 angstroms; metallic filler 252 may have a thickness of about 2500-6500 angstroms. However, these thicknesses may be greater than or less than the above specified thicknesses depending on specific requirements of different implementations.

Figure 3:
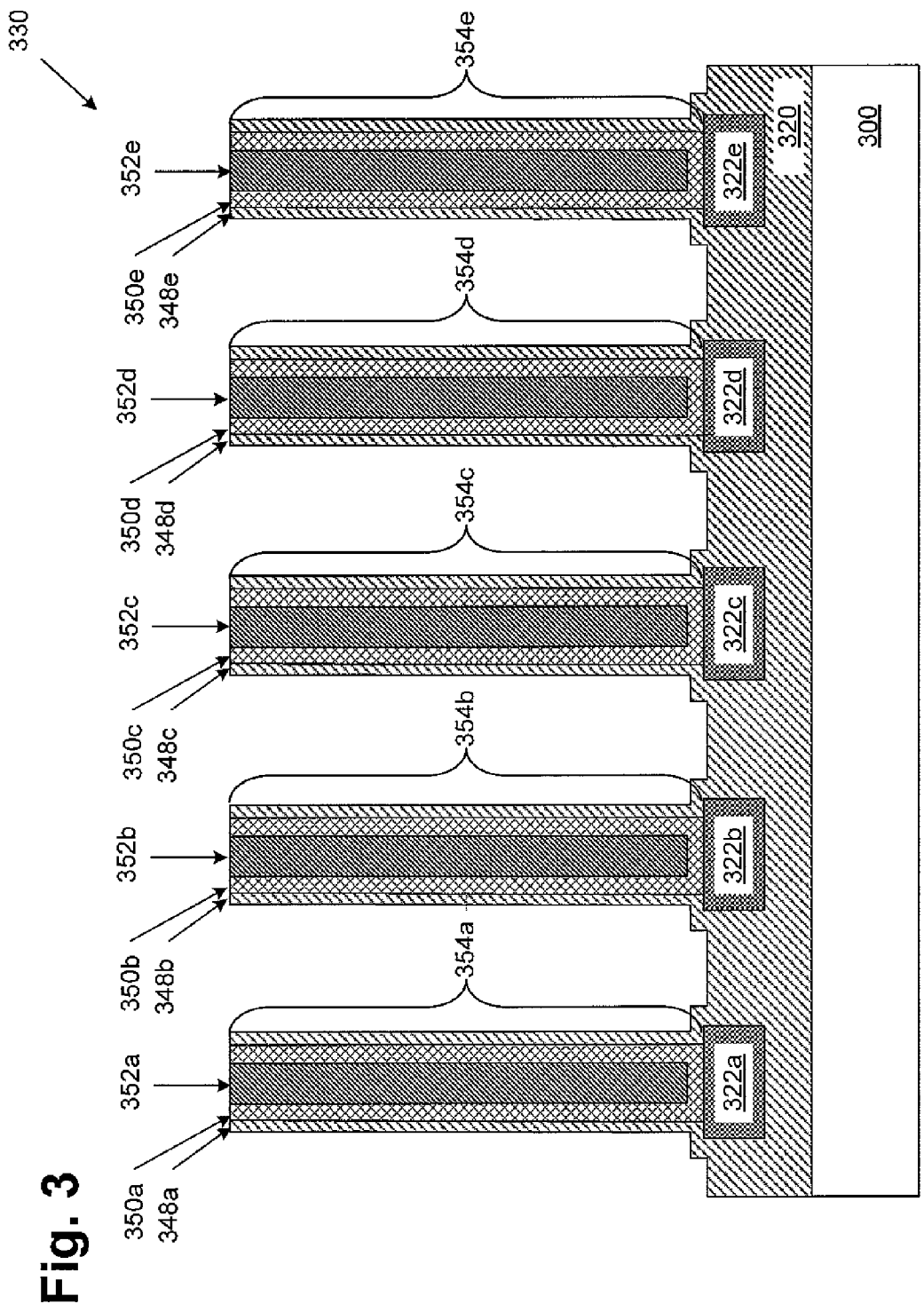
FIG. 3 illustrates a cross-sectional view of an array of self-supported MEMS structures according to one implementation of the present application.

As illustrated in FIG. 3, structure 330 shows an array of self-supported MEMS structures, according an implementation of the present application. Specifically, vias 354a through 354e are formed on MEMS plates 322a through 322e, respectively, in underlying oxide layer 320 over substrate 300. Vias 354a through 354e may each correspond to via 254 in FIG. 2I, and each constitute a self-supported structure over a respective MEMS plate. For example, via 354a is disposed on MEMS plate 322a over substrate 300, where via 354a includes metal liner 350a and metallic filler 352a coated with oxide liner 348a. As illustrated in FIG. 3, vias 354b through 354e have substantially the same structure as via 354a. For example, via 354b includes metal liner 350b and metallic filler 352b coated with oxide liner 348b. Via 354c includes metal liner 350c and metallic filler 352c coated with oxide liner 348c. Via 354d includes metal liner 350d and metallic filler 352d coated with oxide liner 348d. Via 354e includes metal liner 350e and metallic filler 352e coated with oxide liner 348e.

In contrast to vias formed using conventional processes, vias 354a through 354e may have a high aspect ratio of 4:1 or 5:1. In other implementations, instead of forming an array of vias as shown in FIG. 3, methods according to the present application may be used to form a trench-like structure having a metallic filler, where an oxide liner is utilized to encase the sidewalls and the bottom of the trench, such that the trench-like structure can stand on its own over a MEMS plate to form a self-supported MEMS structure.

The present inventive concepts utilize an oxide liner, such as a silicon rich oxide film, to coat the sidewalls of vias formed in a carbonaceous sacrificial material, such as polyimides and other polymer material, to encase metallic structures formed in the vias. The oxide liner prevents the carbonaceous sacrificial material from outgassing or deformation. The oxide liner also enhances the adhesion between the metal structures and the carbonaceous sacrificial material to substantially improve the electrical and mechanical robustness of the vias, such that the vias and underlying MEMS plates form self-supported MEMS structures after the carbonaceous sacrificial material is removed.

Also, the oxide liner provides a chemically resistant surface encasing metallic structure inside the vias, which in turn enables more aggressive and robust BEOL processing. It should be understood that the methods disclosed in the present application are highly scalable, such that arrays of electrical and structural self-supported MEMS features can be formed in a semiconductor wafer according to the present inventive concepts. Also, the methods described in the present application may utilize standard high volume CMOS process modules using high volume CMOS manufacturing methods which are leveraged in such a way to manufacture MEMS devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A self-supported MEMS structure comprising:
   a MEMS plate over a substrate;
   a via situated over said MEMS plate, wherein said via comprises:
      a trench and an oxide liner on sidewalls of said trench;
      a metallic filler in said trench;
   wherein said via is supported only on a bottom thereof by said substrate.

2. The self-supported MEMS structure of claim 1, wherein said oxide liner provides mechanical rigidity for said metallic filler of said via.

3. The self-supported MEMS structure of claim 1, wherein said oxide liner is a silicon rich oxide liner.

4. The self-supported MEMS structure of claim 1, wherein said metallic filler has a substantially co-planar top surface with said oxide liner.

5. The self-supported MEMS structure of claim 1, further comprising a metal liner between said oxide liner and said metallic filler.

6. The self-supported MEMS structure of claim 5, wherein said metal liner comprises a titanium layer, a titanium nitride layer and another titanium layer.

7. A method of forming a self-supported MEMS structure, said method comprising:
   forming a polymer layer over a MEMS plate over a substrate;
   forming a trench over said MEMS plate;
   forming an oxide liner in said trench on sidewalls of said trench;
   depositing a metallic filler in said trench to form a via;
   removing said polymer layer such that said via and said MEMS plate form said self-supported MEMS structure.

8. The method of claim 7, wherein said oxide liner provides mechanical rigidity for said metallic filler of said via.

9. The method of claim 7, further comprising forming a metal liner over said oxide liner in said trench.

10. The method of claim 9, wherein said metal liner comprises a titanium layer, a titanium nitride layer and another titanium layer.

11. The method of claim 9, further comprising planarizing said metallic filler such that said metallic filler has a substantially co-planar top surface with said metal liner and said oxide liner.

12. The method of claim 7, further comprising planarizing said metallic filler by chemical-mechanical polishing.

13. The method of claim 7, wherein said oxide liner is a silicon rich oxide liner.

14. The method of claim 7, wherein said oxide liner is configured to improve adhesion between said metal filler material and said polymer layer.

15. The method of claim 7, wherein said polymer layer comprises polyimides.

16. The method of claim 7, wherein said metallic filler comprises tungsten.

17. The method of claim 7, further comprising forming a first dielectric layer over said polymer layer.

18. The method of claim 17, further comprising forming a metal etch stop layer over said first dielectric layer.

19. The method of claim 18, further comprising forming a second dielectric layer over said metal etch stop layer before said forming said trench.

20. The method of claim 19, further comprising removing said first dielectric layer, said metal etch stop layer and said second dielectric layer.

* * * * *